United States Patent

[11] 3,628,095

[72] Inventors Leon Schwartz
Philadelphia;
William F. Simon, Ambler, both of Pa.

[21] Appl. No. 94,516
[22] Filed Dec. 2, 1970
[45] Patented Dec. 14, 1971
[73] Assignee Sperry Rand Corporation
New York, N.Y.

[54] POWER DISTRIBUTION BUS ARRANGEMENT FOR PRINTED CIRCUIT BOARD APPLICATIONS
5 Claims, 7 Drawing Figs.

[52] U.S. Cl. ....................317/101CC, 29/626, 174/68.5, 174/72 B, 339/17 C
[51] Int. Cl. .................... H05k 1/04
[50] Field of Search .................... 174/68.5, 72 B; 317/101 CC, 101 CM; 339/17 C, 18 B; 29/625, 626

[56] References Cited

UNITED STATES PATENTS

| | | | |
|---|---|---|---|
| 3,418,535 | 12/1968 | Martinell | 174/72 B X |
| 3,461,552 | 8/1969 | Wolf et al. | 174/68.5 X |
| 3,567,999 | 3/1971 | Larson et al. | 317/101 CC |

*Primary Examiner*—Darrell L. Clay
*Attorneys*—Charles C. English, Rene A. Kuypers and William E. Cleaver

ABSTRACT: There is disclosed herein an arrangement for connecting and holding a power distribution bus to a printed circuit board. The bus incorporates flat pads which extend from and are coplanar with it. An oversized hole in each respective pad is provided so that the respective bus may be oriented over an existing plated through hole in the printed circuit board. The leads of an integrated circuit package required to be connected to the voltage or ground potential elements of the power distribution bus are positioned both through the oversized hole of the pad and the plated through hole of the printed circuit board. The connection is made permanent by soldering.

INVENTORS
LEON SCHWARTZ
WILLIAM F. SIMON

BY Rene A. Kuypers
ATTORNEY

POWER DISTRIBUTION BUS ARRANGEMENT FOR PRINTED CIRCUIT BOARD APPLICATIONS

BACKGROUND OF THE INVENTION

1. Field of the Invention

This invention is related to the field of printed circuits, and in particular is related to the field of combining a power distribution bus with a printed circuit card and an integrated circuit.

2. Description of the Prior Art

In a known prior art printed circuit arrangement such as made by Eldre Components, Inc., the power distribution bus is mounted and held to the printed circuit board by means of 90° projections. For the above-mentioned prior art printed circuit board which carries 25 integrated circuit flat packs, over 100 such projections are required. Accordingly, there is a further requirement for over 100 extra plated through holes in the printed circuit board to receive the projections. As is well understood, these projections connected to the printed circuits distribute ground and voltage potentials to the integrated circuits positioned on the board.

In order to make the projection reliable when bent at 90° a heavy gauge copper is required. However, in utilizing a relatively heavy gauge copper a serious problem arises in that it acts as a heat sink when the printed circuit board assembly goes through a wave soldering operation. A result is that excessive warpage is produced in the printed circuit board by the temperature gradient across the thickness of the board, due to heat conducted by the projections up into the heavy gauge copper layers. This gradient persists while the assembly cools below the solidification point of solder, and warpage is retained in the finished board. Warping of the circuit board is obviously undesirable since it introduces stresses in the board materials and particularly, in the plated through holes. Stresses produced in the plated through holes can induce hairline cracks which break the continuity of the circuitry and prevents its proper operation.

The use of the heavy gauge copper that is required in the prior art power distribution bus arrangement has another equally deleterious effect from that previously mentioned in that it adds considerable weight to a large and complex electronic installation such as a computer. This results from the fact that in a computer thousands of printed circuit boards are utilized to support the electronic circuit and components required for operation. Accordingly, it can be readily appreciated that many pounds of excess weight are produced by the heavy gauge copper required in the prior art bus configuration.

Another shortcoming of the known prior art is that in view of the over 100 projections that are required for operation, there is a problem with bending all of them at a perfect 90° bend in proper alignment to make them fit into the plated holes of the printed circuit board. In many instances, the tabs in the holes do not properly line up because of registration tolerances, drilling tolerances and shrinking of the bus insulation due to excessive heat during soldering. This therefore causes numerous problems and reduces production efficiencies.

Another recognized problem with the prior art is that the existing power distribution bus arrangement limits the packing density for the mounting of integrated circuit packages. This results from the fact that every location whereat the 90° projections is secured to the printed circuit at a pad area, there is a requirement for an additional hole in the same area to receive the integrated circuitry lead for connection to the bus. Therefore, the pad area must necessarily be oversized to receive the projection and lead of the two devices. Since there are four such oversized pads per integrated circuit package and since there are 25 packages per prior art printed circuit card, it can be appreciated that there is less space remaining on the printed circuit board for placing additional circuit wire paths. In other words, in comparison with the prior art arrangement, the new method of bus attachment provides additional space for adding additional packages or wiring paths, or both, and thereby increasing the packing density of the printed circuit board. In actual experience, a 20 percent increase in package count per printed circuit board has been possible.

Accordingly, it can be seen from the above discussion that the prior art arrangement for printed circuit board applications has not been entirely satisfactory.

SUMMARY OF THE INVENTION

The power distribution bus projecting tabs utilized with a printed circuit board are made coplanar with the bus and have an oversized hole located therein. The bus is oriented on the printed circuit board so that the oversized holes in the coplanar tabs become aligned with the plated through holes in board. The leads of the integrated circuit package required to be connected to a bus are inserted through the hole in the coplanar tab, and then into the circuit board plated through hole. The integrated circuit lead has a shoulder which bottoms on the top of the tab mechanically pressing the tabs against the plated through holes after being inserted. Accordingly, the hole in the respective tab is retained directly above a plated hole of the printed circuit card for easy wetting of the tab in a subsequent solder operation by solder rising in capillary flow along a particular integrated circuit chip lead. After the package has been properly positioned the leads as well as the bus are permanently bonded to the plated holes by wave soldering.

Since the copper tabs are now coplanar instead of being bent at 90°, gauge thickness has been significantly reduced. Warpage of the printed circuit card is accordingly substantially eliminated since the mass of metal raised to the temperature of molten solder is reduced, and transverse heat flow can achieve an equalization of temperatures on opposite sides of the board. Furthermore since the copper tabs are surface-held, the requirement for any additional plated through holes in the pad area of the printed circuit except those that are required to receive the leads of the integrated circuit package is eliminated. Therefore, the pad area is reduced so that more area is available on the both sides of the printed circuit for increasing the printed circuit board wiring and thereby allowing additional packages to be carried thereon.

DESCRIPTION OF THE PREFERRED EMBODIMENT

Figure 1:
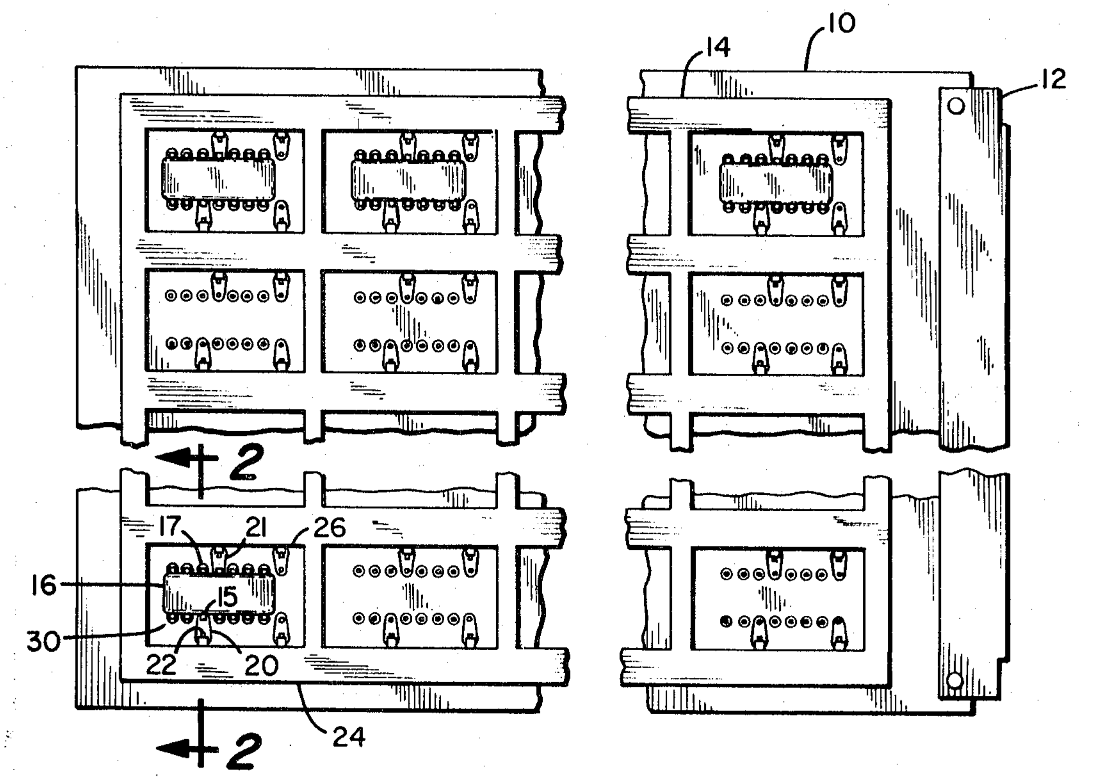
Fig. 1 (PRIOR ART)
FIG. 1 is an overall view of the power distribution arrangement used in the prior art.
Figure 3:
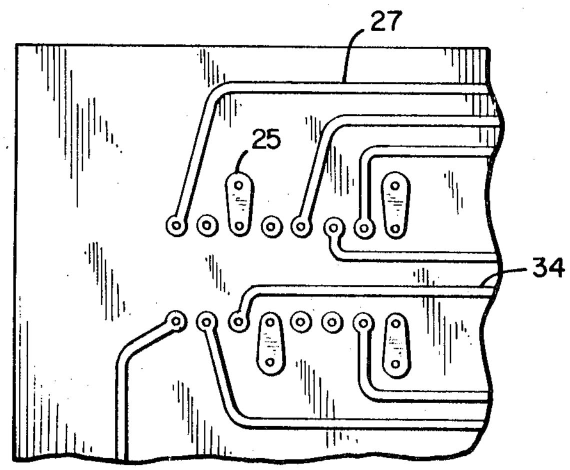
Fig. 3 (PRIOR ART)
FIG. 3 is a view of the underside of the prior art printed circuit card shown in FIG. 1.

Referring now to FIG. 1, there is depicted an arrangement of a printed circuit card 10 as employed in the prior art. As is well known, the printed circuit card 10 has a female connector 12 for interconnecting various conductors which are positioned on the underside of the card 10 to the outside world. Turning briefly to FIG. 3, a conductive pattern comprising, for example, conductors 27 and 34 are shown arranged in the conventional manner. As is well understood, hundreds of printed circuit cards 10 are utilized in an electronic installation such as a large computer. The printed circuit card 10 is utilized primarily to support a plurality of integrated circuit packages 16. The integrated circuit packages 16 are positioned within the rectangular openings of the power distribution bus 14 which is located and permanently placed upon the printed circuit card 10. Integrated circuit packages 16 comprise circuitry for performing logical AND/OR operations, amplification and routing of signals required for the necessary operation of an electronic device. In the known prior art configuration, 25 packages 16 are located on each printed circuit card 10. These packages 16 are arranged such that there are five packages 16 on a side.

In order for the packages 16 to function as intended it is necessary that voltage and ground potentials be distributed throughout the board 10 to its various leads. To accomplish this, the voltage/ground bus 14 is arranged in such a manner that the voltage potential is distributed along one side of the packages by means of the strip 26, whereas ground potential is distributed by the strip 24 on their other side. The voltage and ground strips 24 and 26 are of course insulated from one another by well-known state of the art techniques which are not shown. It should be noted hereat that more than two potentials can be applied throughout the power distribution system herein disclosed, however for purposes of simplicity only two potentials will be discussed.

The power distribution bus 14 is positioned on the board 10, held in place thereon and the potentials distributed to the various packages by means of 90 ° projections 22 which fit into a plated through hole formed in the pad area 20. It should also be noted hereat that a second plated through hole is formed in the pad area 20 for receiving the particular lead of the package 16 to be connected to a particular potential. This aspect of the prior art may be studied in greater detail by referring to FIG. 2. Thus, the power distribution bus 14 distributes ground potential and is held in place by means of the 90° projection 22 extending from the bus strip 24. The 90° projection enters the hole in the upper pad area 20, the plated through hole in the printed circuit board 10, and exits from the lower pad area 25. The lead 15 of the package 16 enters a second hole in the pads 20 and 25 as well as a second plated through hole in the printed circuit board 10.

In like manner, the lead 17 is positioned through the holes formed in the pad 32, the board 10 and the conductor 34. The orientation of the voltage strip 26 associated with the bus 14 is depicted with respect to the lead 17 but no connection is shown in view of the manner that section 2—2 is taken. After the packages 16 are all in position, they and the bus 14 are permanently anchored to the board 10 by wave soldering. Accordingly, in the example shown, the lead 15 is permanently connected to ground via the double holed pads 20 and 25 and the 90° projection. In the prior art embodiment, 108 extra plated holes are required in the circuit board 10 to accept the 90° projection 22. Furthermore, a relatively heavy 10 mil copper gauge is used for each respective volt/ground bus to make the projections reliable since the thick narrow tab projections have to withstand the manufacturing, bending and storage problems.

Figure 2:
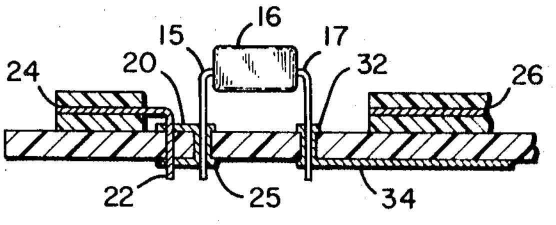
Fig. 2 (PRIOR ART)
FIG. 2 is a section of FIG. 1 viewed in the direction of 2—2.

Referring now to the top and underside of the printed circuit board 10 as shown in FIGS. 2 and 3, it can be seen that the pad areas 20 and 25 required to receive the leads 15 and 22 must be doubly large since it is required that the two leads be inserted thereto. Since so much additional room is required by the double pad areas 20 and 25, less space is left on the board for positioning a conductive pattern thereon. This factor prevents the high packing density of packages 16 and therefore increases the weight and bulk of a large electronic installation.

Figure 4:
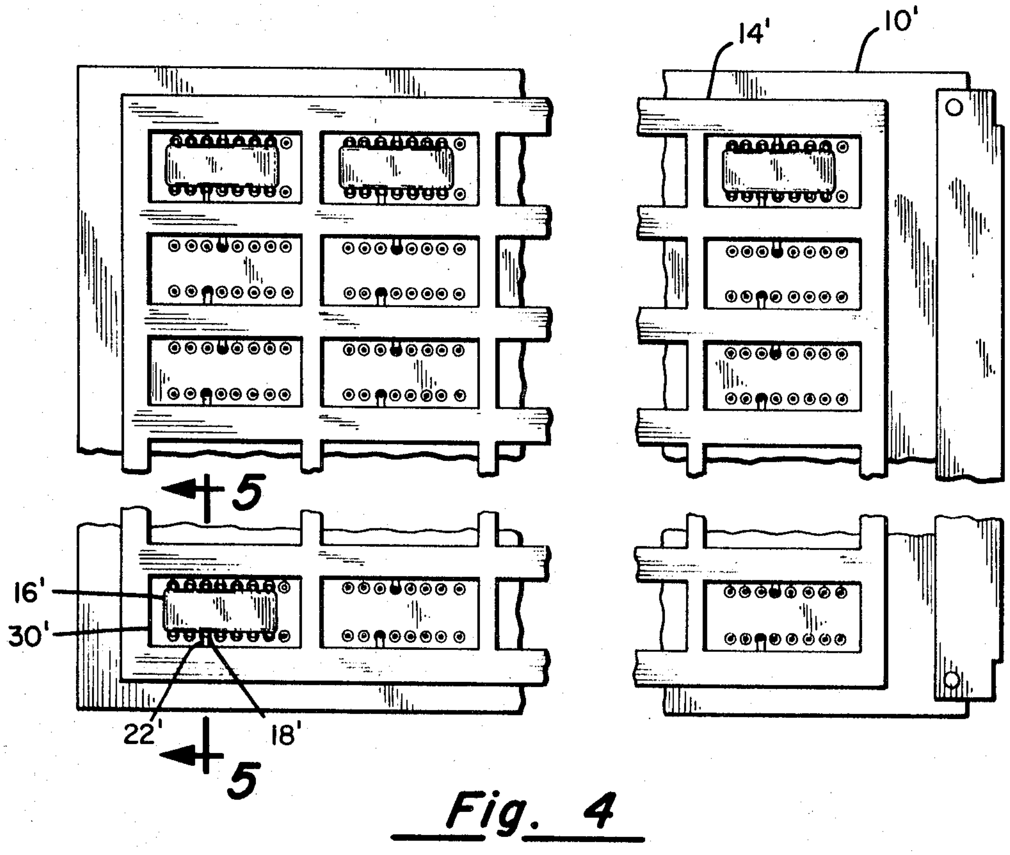
FIG. 4 is an overall plan view of the subject invention.

Reference is now made to the arrangement of the instant invention as depicted in FIG. 4. The significant improvement for increasing the packing density of the packages 16' comprises utilizing a new form of connecting the power distribution bus 14' to the printed circuit board 10'. The tabs or projections 22' are formed so that they are coplanar with the bus 14' and include a large hole located therein. The coplanar tab 22' is oriented over an existing plated through hole in the printed circuit card 10' so that the respective holes are aligned.

Figure 5:
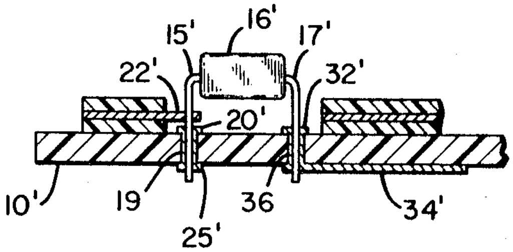
FIG. 5 is a section of FIG. 4 viewed in the direction 5-5.
Figure 7:
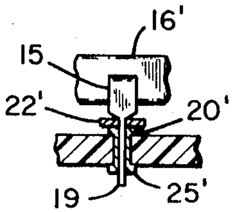
FIG. 7 is an enlarged view of the integrated circuit package lead insert into a plated through hole.

This particular arrangement can be seen more clearly by referring to FIG. 5 wherein the coplanar tab 22' is shown oriented directly over the hole in the pad 20 ' and the plated through hole 19. Therefore, the lead 15' is inserted through both the oversized hole in the pad 22' and the plated through hole 19. Similarly, the lead 17' is inserted through the holes provided for in pad 32' , the printed circuit conductor 34' and the plated through hole 36. Referring briefly to FIG. 7, it can be seen that as the integrated circuit package is inserted in a plated through hole 19, the shoulder of the lead depresses the tab 22' against pad 20'. After all of the packages 16' have been positioned in place the entire assembly is placed in a wave soldering bath so that all of the connections are made permanent. As is well understood the solder enters into the plated through hole and rises upwardly so that a permanent connection is made to the plated through hole, the lead 15' and the tab 22'. In like manner, the lead 17' is permanently connected to the plated through hole 36 formed in the board 10', the conductor 34' and the pad 32'.

Figure 6:
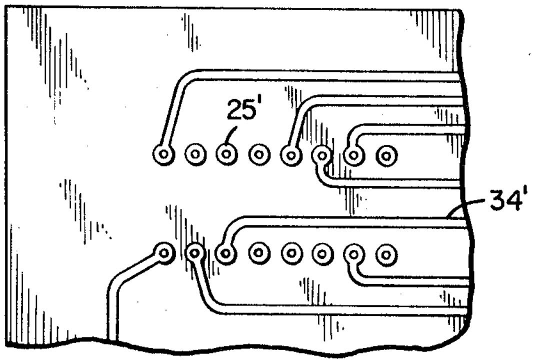
FIG. 6 is a view of the underside of the printed circuit board shown in FIG. 4.

As can be appreciated from the above description, the pad areas 20' and 25' are reduced in half. This is the case since the coplanar tab 22' extending from the bus 14' does not enter the pad area but is merely positioned over an existing plated through hole designed to receive an integrated circuit package lead. This can be appreciated by referring to FIG. 6 wherein the plated through holes are all of the same size. Accordingly, many additional conductors such as 34' can be located along the top and bottom of the printed circuit board 10'. Therefore, additional flat packs can be easily supported by the board 10'.

The present invention allows 20 percent or five additional integrated circuit packages 16' to be positioned on the printed circuit card 10'. Increasing the number of packages by this amount therefore permits a material increase in the packing density on the board 10'. This is a significant improvement in the art of electronic packaging since fewer printed circuit cards 10 can be used than formerly required. In a large scale computer installation this is important since by utilizing more packages per printed circuit card there is a corresponding reduction in the number of these cards required. Furthermore, the fewer the printed circuit cards the lower the total weight of the installation, the easier its servicing and the lesser the bulk.

What is claimed is:

1. The power distribution system comprising:

a printed circuit board, said board having a plurality of plated through holes having external pads arranged in a pattern for receiving the leads of integrated circuit packages, said pattern being located on said board with said circuits arranged in columns and rows providing certain spaces therebetween;

conductor means located between said spaces for distributing voltage and ground potentials to said respective circuits, coplanar tab means integral with said respective conductor means, which include a hole extending through said conductor means, said conductor means being oriented with said coplanar tab means including respective holes over certain ones of said plated through holes for receiving said leads of said integrated circuit, the leads of said integrated circuit extending through the holes of said tab means and into the plated through holes, means permanently connecting said respective leads and said coplanar means to said plated through hole.

2. The combination in accordance with claim 1 wherein at least 30 integrated circuits are located on said printed circuit board.

3. The combination in accordance with claim 1 wherein said conductor means are made of copper.

4. The combination in accordance with claim 3 wherein said conductor means has a gauge thickness of approximately 5 mils.

5. The combination in accordance with claim 3 wherein said integrated circuit lead has a shoulder which engages said voltage/ground tab means with the pad of said printed circuit board.

* * * * *